(12) United States Patent
Hong et al.

(10) Patent No.: US 6,849,477 B2
(45) Date of Patent: Feb. 1, 2005

(54) METHOD OF FABRICATING AND MOUNTING FLIP CHIPS

(75) Inventors: Soon-Min Hong, Seoul (KR); Young-Jun Moon, Suwon (KR); Min-Young Park, Seongnam (KR); Sea-Gwang Choi, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/372,280

(22) Filed: Feb. 25, 2003

(65) Prior Publication Data

US 2004/0072387 A1 Apr. 15, 2004

(30) Foreign Application Priority Data

Oct. 12, 2002 (KR) .................. 10-2002-0062297

(51) Int. Cl.[7] .............................................. H01L 21/44
(52) U.S. Cl. .................. 438/106; 438/110; 438/115; 438/120; 438/127
(58) Field of Search ................. 438/106–127

(56) References Cited

U.S. PATENT DOCUMENTS

| | | | | |
|---|---|---|---|---|
| 3,922,712 A | * | 11/1975 | Stryker | 257/737 |
| 4,921,157 A | | 5/1990 | Dishon et al. | |
| 4,926,022 A | * | 5/1990 | Freedman | 219/121.63 |
| 5,000,819 A | * | 3/1991 | Pedder et al. | 216/69 |
| 5,223,691 A | * | 6/1993 | Frei et al. | 219/121.46 |
| 5,334,804 A | * | 8/1994 | Love et al. | 174/267 |
| 5,532,612 A | * | 7/1996 | Liang | 324/760 |
| 5,736,456 A | * | 4/1998 | Akram | 438/614 |
| 5,763,854 A | * | 6/1998 | Dittman et al. | 219/121.63 |
| 5,767,010 A | * | 6/1998 | Mis et al. | 438/614 |
| 6,229,207 B1 | * | 5/2001 | Master | 257/697 |
| 6,586,322 B1 | * | 7/2003 | Chiu et al. | 438/612 |

FOREIGN PATENT DOCUMENTS

EP  1 043 766 A1  10/2000

OTHER PUBLICATIONS

Korean Patent Abstract, Publication No. 2000–778, Published Jan. 15, 2000, Choi et al. (Abstract Only).

* cited by examiner

*Primary Examiner*—Matthew Smith
*Assistant Examiner*—Renzo N. Rocchegiani
(74) *Attorney, Agent, or Firm*—Staas & Halsey LLP

(57) ABSTRACT

A method of fabricating and mounting a flip chip includes using an environmentally friendly plasma gas, which minimizes safety hazards during an implementation of the method and does not require an additional heat source during a reflow process thereof. That is, the method includes reflowing a solder bump using an argon-hydrogen plasma process. The argon-hydrogen plasma process used to fabricate the flip chip includes maintaining a pressure in a chamber at 250 to 270 mtorr, feeding a mixed gas of argon with 10 to 20% hydrogen to the chamber to generate a plasma with power of 100 to 200 W, and exposing the flip chip to the plasma for 30 to 120 seconds. Additionally, an argon-hydrogen plasma process used to mount the flip chip includes maintaining pressure in a chamber at 100 to 400 mtorr, feeding a mixed gas of argon with 0 to 20% hydrogen to the chamber to generate a plasma with power of 10 to 50 W, and exposing the flip chip to the plasma for 10 to 120 seconds.

4 Claims, 11 Drawing Sheets

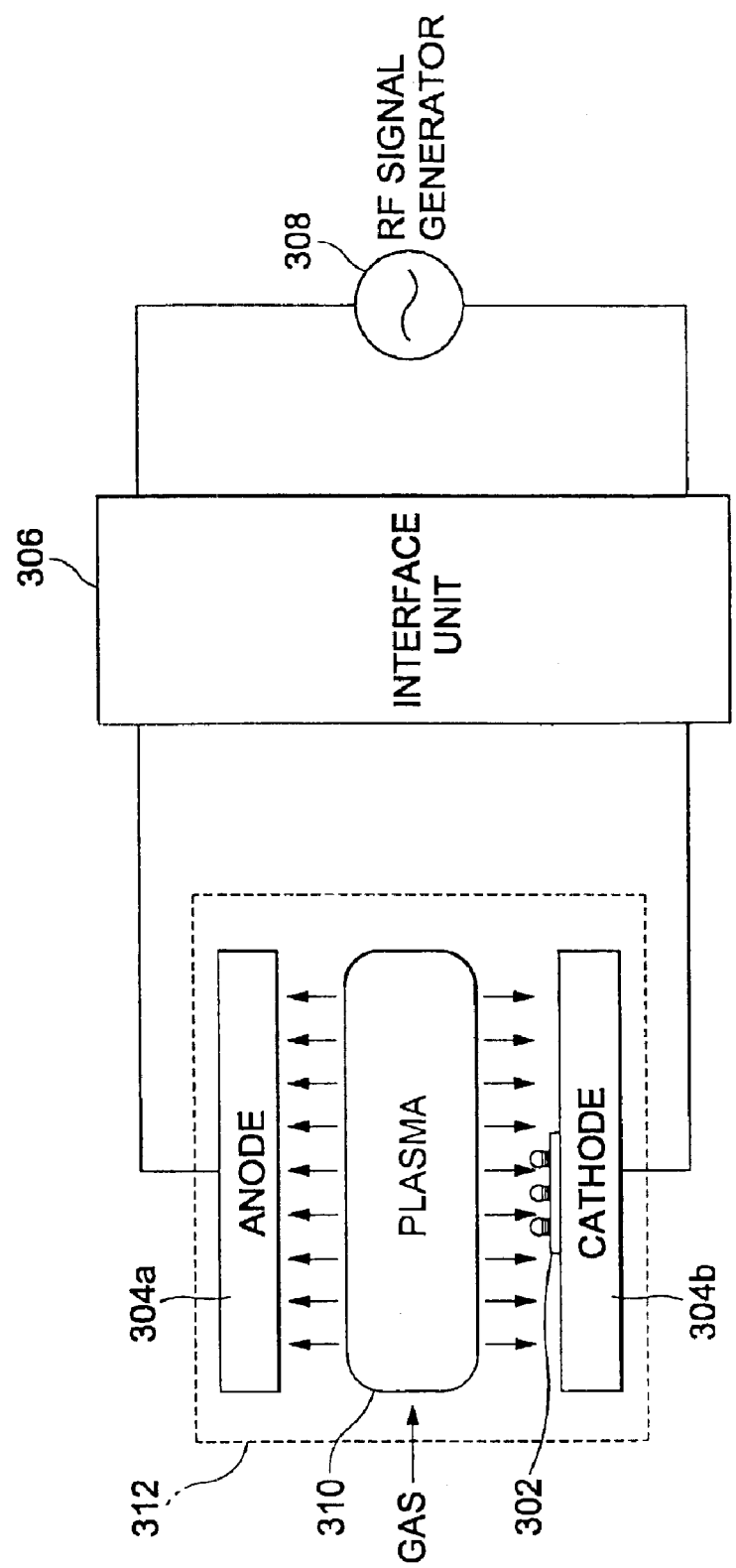

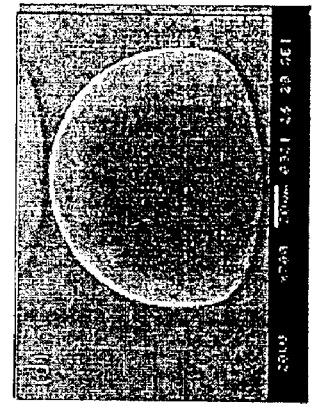
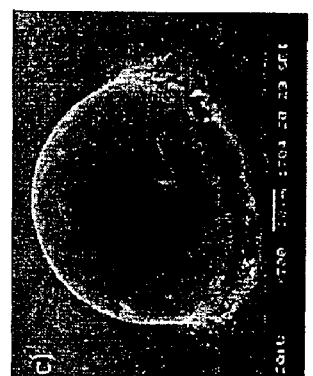
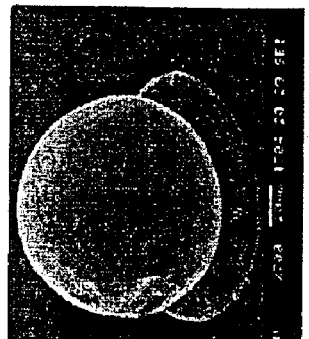
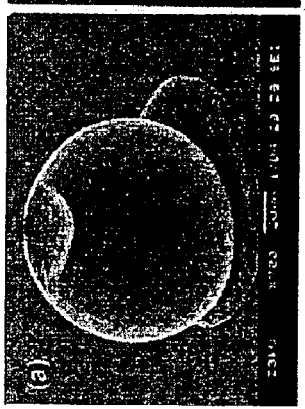
FIG. 7A  FIG. 7B  FIG. 7C  FIG. 7D
FIG. 7E  FIG. 7F  FIG. 7G  FIG. 7H

METHOD OF FABRICATING AND MOUNTING FLIP CHIPS

CROSS-REFERENCE TO RELATED APPLICATIONS

This application claims the benefit of Korean Patent Application No. 2002-62297, filed Oct. 12, 2002, in the Korean Intellectual Property Office, the disclosure of which is incorporated herein by reference.

BACKGROUND OF THE INVENTION

1. Field of the Invention

The present invention relates to a method of fabricating and mounting flip chips, and in particular, to a method of fabricating and mounting flip chips without using a flux.

2. Description of the Related Art

Generally, a solder bump flip chip packaging method comprises forming a plurality of microscopic solder bumps having a diameter of 200 μm or less on a front side of a device chip, and bonding the solder bumps to a circuit board, thereby mounting the device chip on the circuit board. Such a solder bump flip chip packaging technology has a smaller mounting area and a higher mounting density than other conventional chip packaging technologies.

Aluminum is used as an input and an output pad of a device in a form of a flip chip package. However, a wettability of solder bumps to the aluminum is poor. Accordingly, an under bump metallurgy (UBM) layer is deposited on the aluminum pads so as to secure an improved wettability.

Methods of coating a predetermined amount of a solder on the UBM layer include a heat deposition method, an electrolytic plating method, a stencil printing method, a stud wire bumping method, and a laser ball bonding method. The above methods all accompany a reflow process, after a solder coating process, in which the solder is melted to form solder bumps having a sphere shape. The reflow process is also conducted so as to homogenize a composition and a height of the solder bumps, and improve bonding strength of the solder bumps to the corresponding UBM layer.

In a conventional reflow process, a so-called flux is coated on a solder prior to the melting of the solder. The flux functions to remove an oxide film from a solder surface during the reflow process and prevent the solder from re-oxidizing to reshape the melted solder in a form of a sphere by a surface tension thereof. However, after the application of the flux, if the flux remaining around the solder bumps is not sufficiently removed, the highly corrosive flux around the solder bumps corrodes a circuit board bonded to a chip package having the solder bumps, to negatively affect the operation and reliability of the circuit board.

A conventional solvent used to rinse the flux contains volatile organic compounds, and therefore causes air pollution leading to the destruction of the ozone layer and global warming. Accordingly, international restrictions, for example, Montreal Convention of 1992, on use of such a solvent have increased dramatically. In addition, because the solder bumps of a conventional flip chip have become smaller in size and an interval between the solder bumps has become narrower with the development of a flip chip package technology, it is increasingly more difficult to sufficiently rinse and remove the flux from the solder bumps. To solve this, flux-free bumping technologies of reflowing the solder bumps without the flux have been proposed.

Conventional flux-free bumping technologies are classified into a process using a carboxylic acid vapor and a process using a plasma. According to the process using the carboxylic acid, an oxide film on a solder surface is reduced using gas containing carboxylic acid, such as a formic acid and an acetic acid, during a reflowing of the solder. However, this process has a disadvantage in that wasted gas containing large quantities of the carboxylic acid is produced, and this gas inevitably must be treated.

In Japanese Patent Laid-open Publication No. 5-500026 (U.S. Pat. No. 4,921,157), there is disclosed a process using a fluorine-containing plasma, in which an oxide film that obstructs a wetting of a melted solder to a flip chip during a reflowing of the solder is converted into a fluorinated oxide film, by fluorinating a solder surface using the fluorine contained plasma. However, this process has disadvantages in that hydrogen hexafluoride used in this process is environmentally harmful. Furthermore, the fluorine plasma corrodes silicon and a passivation film, and a silicon tetrafluoride product damages the solder bumps. Another disadvantage of this process is that the remaining fluorine negatively affects the reliability of a resulting chip package according to an amount of the remaining fluorine.

Korean Patent Laid-open Publication No. 2000-778 discloses a method of reflowing indium bumps using a 100% pure hydrogen plasma. However, this method has a disadvantage in that hydrogen is a dangerous and highly explosive material.

On the other hand, Korean Patent Laid-open Publication No. 2001-32162 (EP 1043766-A1) discloses a method of reflowing a solder, the method comprising generating a plasma using a mixed gas containing 3 to 8% hydrogen, etching an oxide film of a solder surface, and heating the solder using a halogen lamp. However, in this method, there is a disadvantage of needing the halogen lamp as an additional heat source to reflow the solder as a process of removing the oxide film and a process of heating the solder are separately conducted.

SUMMARY OF THE INVENTION

Accordingly, an aspect of the present invention is to provide a method of fabricating and mounting solder bump flip chips, which does not use a flux and overcomes the above described disadvantages connected to conventional methods of treating an oxide film of a solder using a plasma.

Another aspect of the present invention is to provide a method of fabricating and mounting solder bump flip chips, which uses an environmentally friendly plasma gas, and which minimizes safety hazards during the implementation of the method and does not require an additional heat source during a reflow process.

Additional aspects and advantages of the invention will be set forth in part in the description which follows and, in part, will be obvious from the description, or may be learned by practice of the invention.

To achieve the above and/or other aspects of the present invention, there is provided a method of fabricating flip chips having a solder bump, the method comprising bonding the solder bump to an under bump metallurgy layer formed on the flip chip, and reflowing the solder bump using an argon-hydrogen plasma process. The argon-hydrogen plasma process may comprise maintaining a pressure in a range of 250 to 270 mtorr, providing a mixed gas of argon with 10 to 20% hydrogen with power in a range of 100 to 200 W to generate a plasma thereof, and exposing the flip chip to the plasma for 30 to 120 seconds.

To achieve the above and/or other aspects of the present invention, there is provided a method of mounting a flip chip having a solder bump on a circuit board, the method comprising etching the solder bump of the flip chip using an argon-hydrogen plasma process, and mounting the flip chip on the circuit board. Here, the argon-hydrogen plasma process may comprise maintaining a pressure in a range of 100 to 400 mtorr, providing a mixed gas of argon with 0 to 20% hydrogen with power in a range of 10 to 50 W to generate a plasma thereof, and exposing the flip chip to the plasma for 10 to 120 seconds.

BRIEF DESCRIPTION OF THE DRAWINGS

These and/or other aspects and advantages of the invention will become apparent and more readily appreciated from the following description of the preferred embodiments, taken in conjunction with the accompanying drawings of which:

FIG. 3 is a block diagram illustrating a plasma device used to fabricate the solder bumps according to the present invention;

FIGS. 7A to 7D are perspective views illustrating the flip chip solder bump according to the present invention and various flip chip solder bumps reflowed under different conditions;

FIG. 7E to 7H are side views of the FIGS. 7A to 7D, respectively;

DETAILED DESCRIPTION OF THE PREFERRED EMBODIMENTS

Figure 1A:
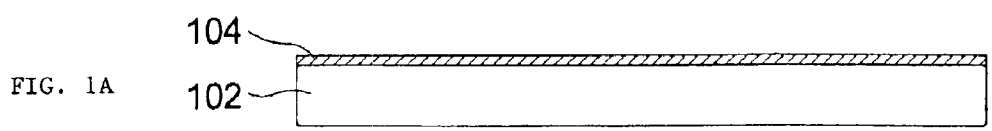
FIGS. 1A to 1H are schematic sectional views illustrating a stepwise fabrication procedure of solder bumps of a flip chip using a plasma reflow process according to an embodiment of the present invention.
Figure 1B:
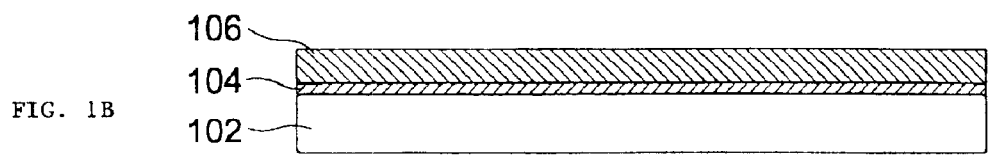
Figure 1C:
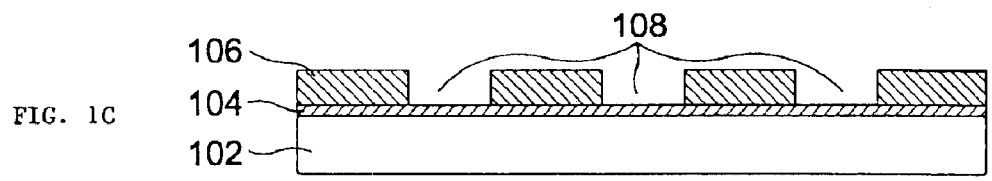
Figure 1D:
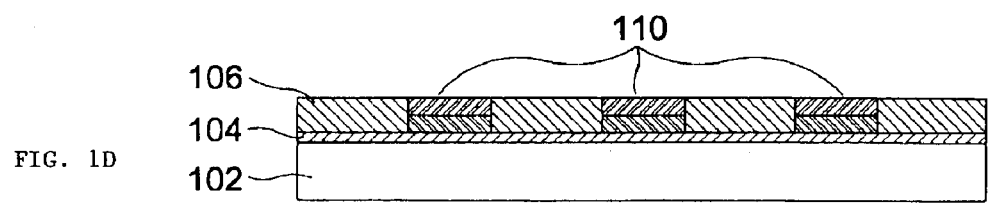
Figure 1E:
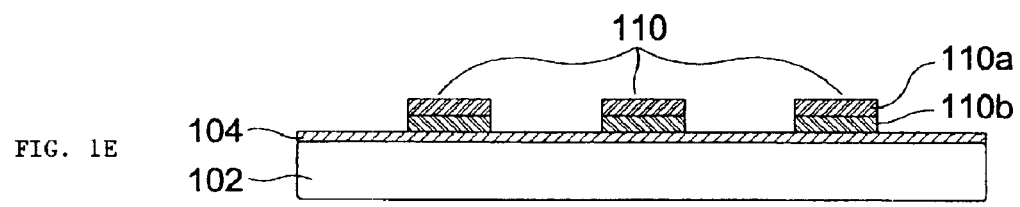
Figure 1F:
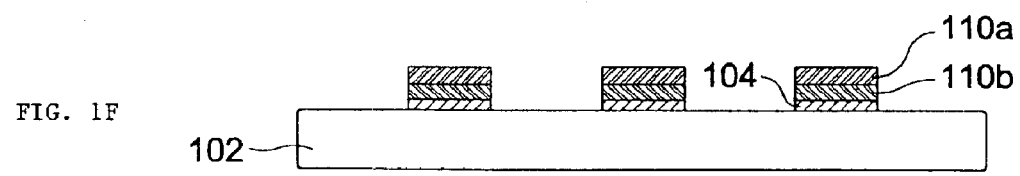
Figure 1G:
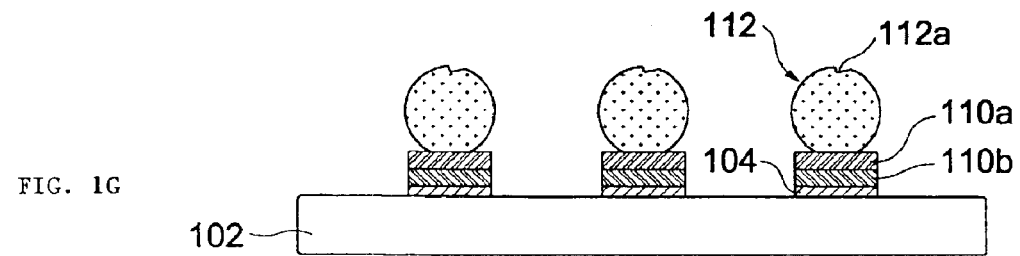
Figure 1H:
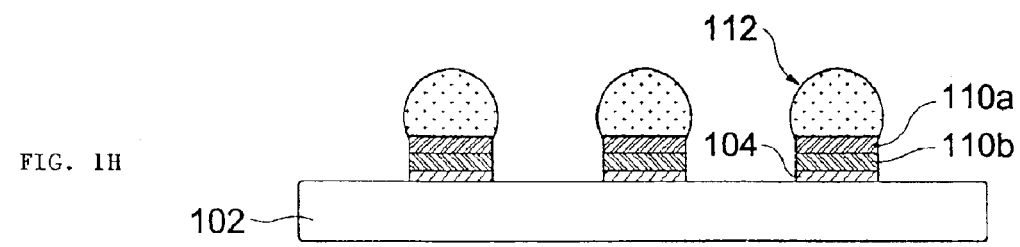
Figure 2A:
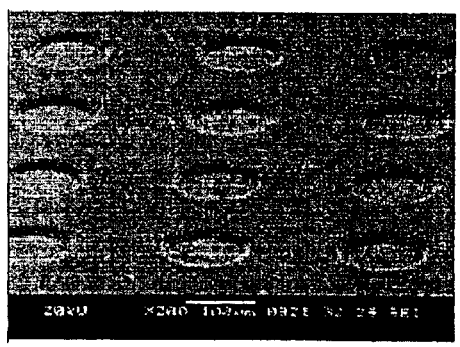
FIGS. 2A to 2D are perspective views illustrating the resulting structures stepwisely obtained through the fabrication procedure of the solder bumps as shown in FIG. 1.
Figure 2B:
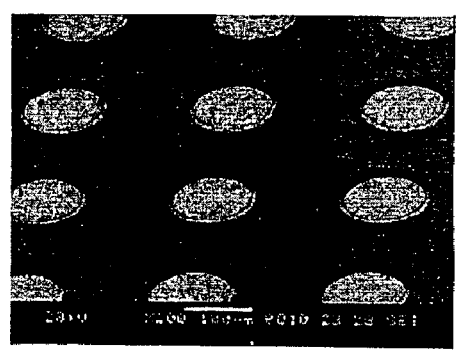
Figure 2C:
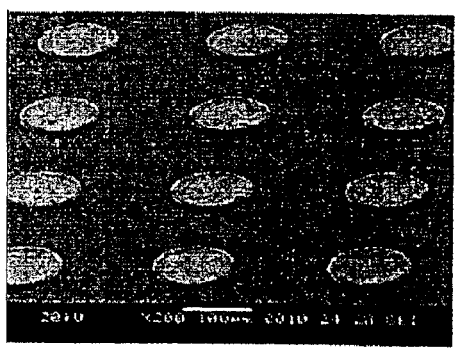
Figure 2D:
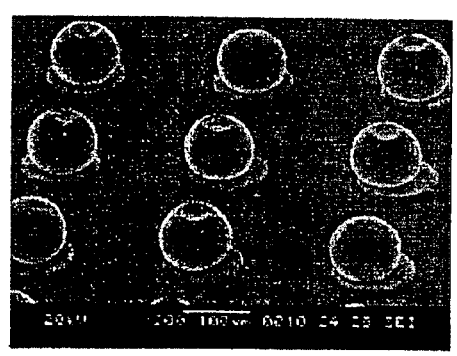

Reference will now be made in detail to the embodiments of the present invention, examples of which are illustrated in the accompanying drawings, wherein like reference numerals refer to like elements throughout. The embodiments are described below in order to explain the present invention by referring to the figures.

FIGS. 1A to 1H illustrate a stepwise fabrication procedure of solder bumps of a flip chip using a plasma reflow process according to an embodiment of the present invention. FIGS. 2A to 2D show the resulting structures obtained through the fabrication procedure of the solder bumps as shown in FIGS. 1A to 1H. In FIGS. 2A to 2D, a pitch interval is 250 $\mu$m, and a diameter of each solder bump is 100 $\mu$m.

As shown in FIGS. 1A to 1H, a seed layer 104 comprising, for example, a Cr/Cu thin film for an electrolytic plating process is deposited on a silicon chip 102. A thick film positive photoresist 106 with a thickness of, for example, 9 $\mu$m is then coated on the seed layer 104, and subjected to a photo engraving process to form circular UBM patterns 108 with a diameter of 100 $\mu$m. Cu and Ni are plated on the UBM patterns 108 in sequence under a current density condition of 10 mA/cm$^2$ so as to form the Cu and Ni layers 110b and 110a, each having a thickness of 4 $\mu$m, thereby forming a Cu/Ni UBMs 10 using the UBM patterns 108 as a mold. The thick film photoresist 106 and the seed layer 104 are then removed in sequence to form the Cu/Ni UBMs 110 with a diameter of 100 $\mu$m. A plurality of Sn–3.5 wt % Ag solder balls 112 with a diameter of 100 $\mu$m are bonded to the Cu/Ni UBMs 110 by a laser solder ball bumping process. According to the laser solder ball bumping process, the solder balls 112 are set on the Cu/Ni UBMs 110 using a hollow capillary with a diameter of 125 $\mu$m, and an Nd:YAG laser beam with a wavelength of 1064 nm is instantaneously irradiated to the solder balls 112 under a condition of a 65 A electric current and a 3 ms laser pulse width to bond the solder balls 112 to the Cu/Ni UBMs 110. Each of the solder balls 112, which may have a crater 112a, is reshaped by a reflow process of the present invention in a form of a sphere and mounted at a center of a corresponding UBM surface, thereby mounting a solder bump on the corresponding Cu/Ni UBM.

FIG. 3 shows a plasma device used to fabricate the solder bumps according to the present invention. With reference to FIG. 3, for example, a 13.56 MHz RF signal generated from an RF signal generator 308 is applied through an interface unit 306 to an anode 304a and a cathode 304b positioned in a chamber 312. An argon-hydrogen (Ar+H$_2$) mixture gas is fed into the chamber 312, and the RF signal is electrically discharged to the argon-hydrogen mixture gas to generate a plasma 310. A flip chip 302 is positioned between the anode 304a and the cathode 304b in the chamber 312, and the plasma is applied to the flip chip 302 to perform an etching and a reflow process.

In this embodiment, an initial pressure in the chamber 312 is set to 5 mtorr or lower, and a mixed gas of argon with 10 to 20% hydrogen is used as a plasma gas. With time, the pressure in the chamber 312 is increased to 200 to 300 mtorr, and the flip chip 302 is exposed to the plasma gas 310 with a power of 100 to 200 W for 30 to 120 seconds. At this time, argon ions of the plasma collide against surfaces of the solder balls 112 to break oxide films on the surfaces of the solder balls 112. In addition, hydrogen ions of the plasma reduce the oxide films on the solder balls 112 and/or provide a reductive atmosphere to prevent the surfaces of the solder balls 112 from being re-oxidized. Furthermore, the solder balls 112 are heated to their melting point or higher, owing to a kinetic energy of a collision of ions against the solder balls 112, to be melted and wet the surface of the Cu/Ni UBMs 110. Accordingly, the solder balls 112 are firmly bonded to the Cu/Ni UBMs 110, and each of the solder balls 112 is reshaped in a form of a sphere due to a surface tension of the liquefied solder ball.

FIGS. 4A to 4D illustrate a stepwise fabrication of a solder bump of the flip chip using the plasma device of FIG. 3, according to the present invention. In particular, a reflow process of the solder bump using the argon-hydrogen plasma is illustrated.

Figure 4A:
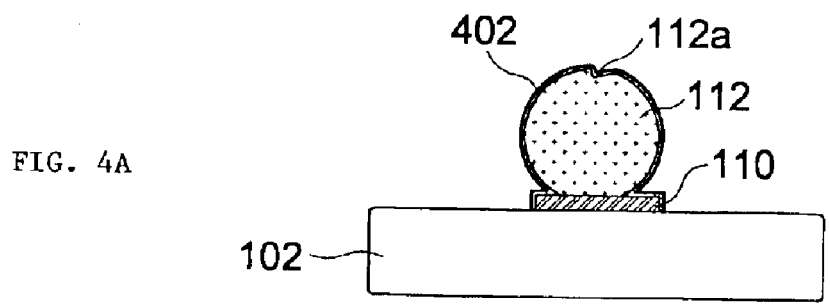
FIGS. 4A to 4D are schematic sectional views illustrating a stepwise fabrication of a solder bump of the flip chip using the plasma device of FIG. 3 according to the present invention.
Figure 4B:
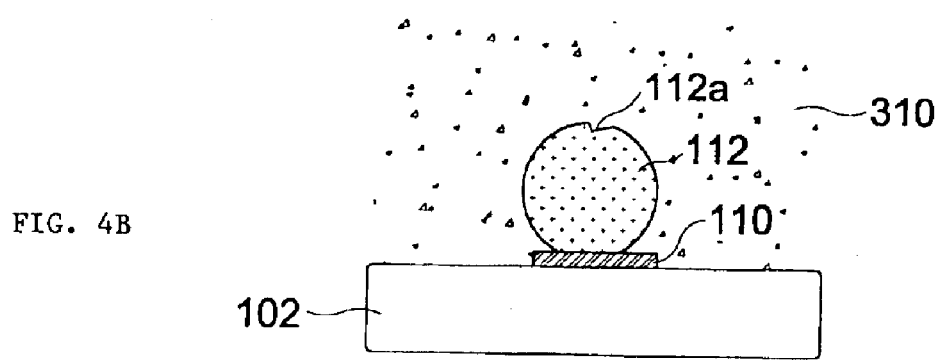

In FIG. 4A, the solder ball 112 is subjected to a laser ball bumping process on the Cu/Ni UBM 110 positioned on the silicon chip 102. At this time, the UBM 110 is partly bonded to the solder ball 112, and a crater 112a is formed on an upper portion of the solder ball 112. Additionally, the solder ball 112 and the UBM 110 are surrounded with an oxide film 402. As the solder ball 112 and the Cu/Ni UBM 110 surrounded with the oxide film 402 are reflowed by the plasma, argon ions (Ar+) collide with the oxide film 402 on the solder ball 112 and the Cu/Ni UBM 110 to break and remove the oxide film 402, as shown in FIG. 4B.

Figure 4C:
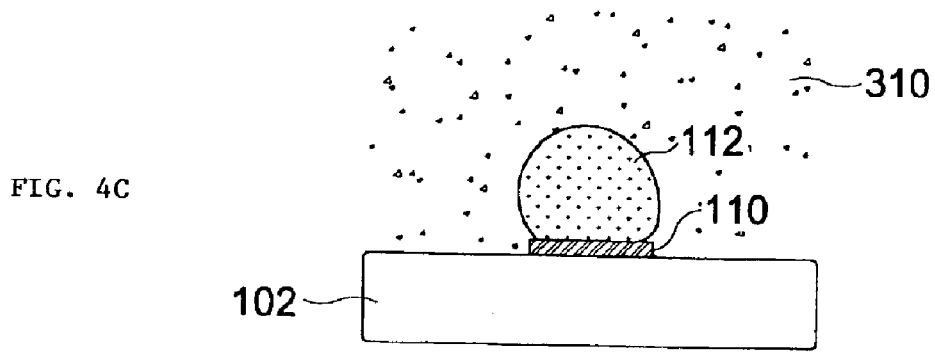

Furthermore, as shown in FIG. 4C, the solder ball 112 is heated and melted due to a kinetic/collision energy of ions, which is converted into a heat energy. Here, a re-oxidation of the solder ball 112 is prevented due to a reductive atmosphere of the hydrogen plasma, thus desirably wetting the Cu/Ni UBM 110 with the melted solder ball 112.

Figure 4D:
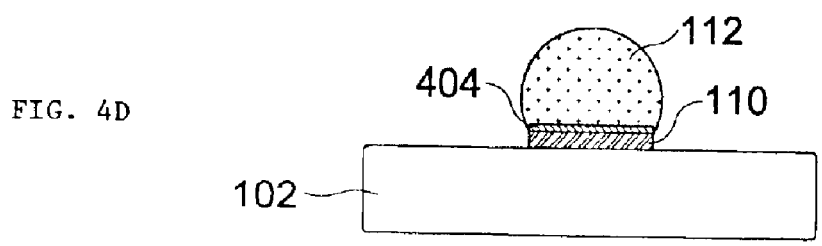

Through the above-described procedure, an intermetallic compound 404 is formed, and a reshaping process in which the melted solder ball 112 forms a sphere shape due to a surface tension thereof and a self-alignment process in which the solder ball 112 is positioned at a center of a UBM surface are accomplished, as shown in FIG. 4D.

Figure 5A:
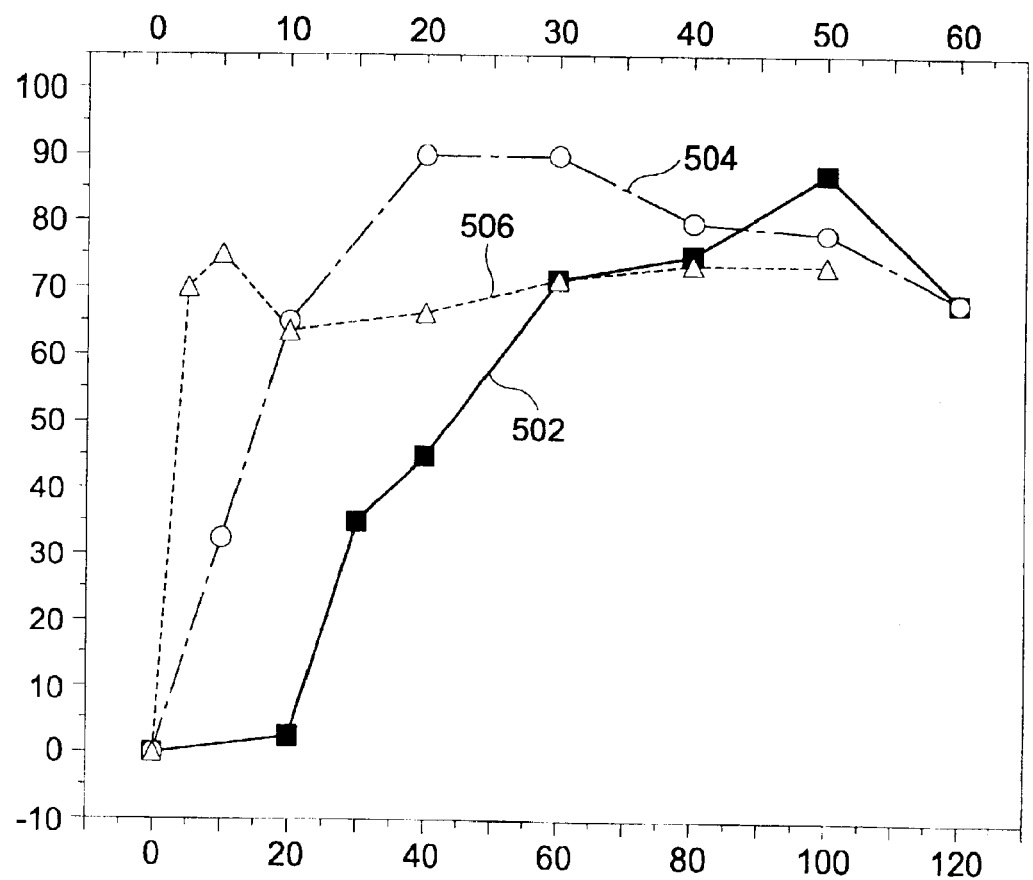
FIG. 5A is a graph illustrating bonding strength characteristics of the solder bumps of the flip chip according to the present invention.

FIG. 5A shows a graph illustrating bonding strength characteristics of solder bumps of flip chips. That is, the graph is a shear test graph showing the bonding strength of an Sn–3.5 wt % Ag solder bump to a Cu/Ni UBM as a function of time required in a reflowing process, using a plasma according to the present invention and a conventional heat plate. In a shear test, a maximum load applied to a shear tool is measured by positioning the shear tool higher than the Cu/Ni UBM by 5 μm, and moving the solder bump at a speed of 200 μm/s. Three characteristic curves 502, 504, and 506 of FIG. 5A all show a variance in shear strength of the solder bump, in which a first characteristic curve 502 shows the shear strength of the solder bump in the case of using an argon-hydrogen plasma with power of 100 W, a second characteristic curve 504 shows the shear strength of the solder bump in the case of using an argon-hydrogen plasma with power of 200 W, and a third characteristic curve 506 shows the shear strength of the solder bump where a conventional reflow process is conducted using a flux at 250° C.

In the case of the first characteristic curve 502, the shear strength is slightly increased until the reflowing time is 20 seconds, greatly increased after 30 seconds, has the maximum shear strength of an 85 g-force at 100 seconds, and is reduced after 100 seconds. On the other hand, in the case of the second characteristic curve 504, the shear strength is rapidly increased after 10 seconds, reaches the maximum shear strength at 20 seconds, and is reduced after 20 seconds. As shown in FIG. 5A, the shear strength of the solder bump reflowed by a plasma according to the present invention 502/504 is higher than that of the solder bump reflowed using a conventional flux 506.

Figure 5B:
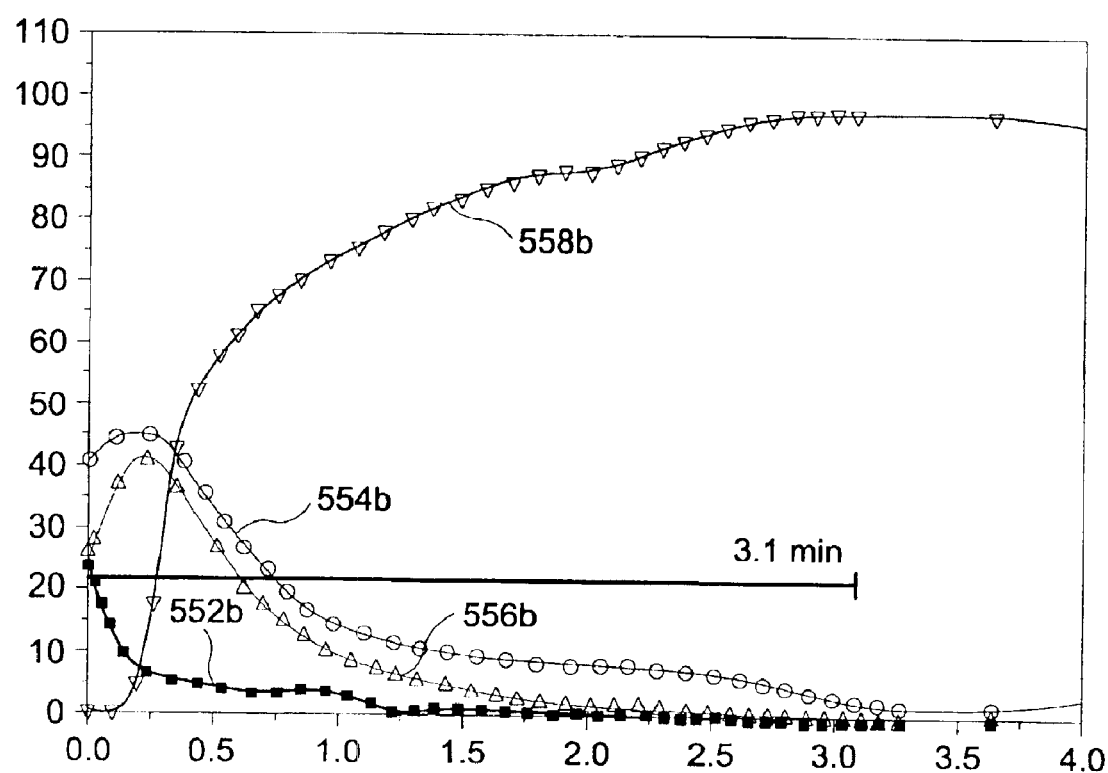
FIGS. 5B and 5C are graphs illustrating results of an auger electron spectroscopy (AES) of a solder bump surface before and after a plasma treatment of the present invention, respectively.
Figure 5C:
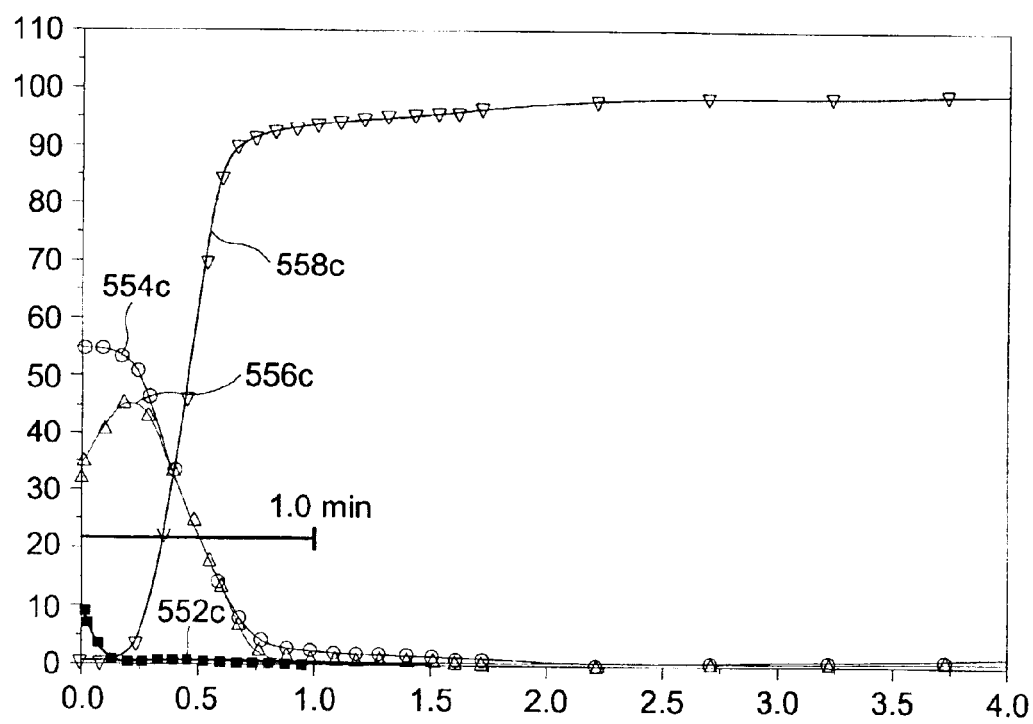

FIGS. 5B and 5C are graphs illustrating results of an auger electron spectroscopy (AES) of a solder bump surface before and after a plasma treatment of the present invention, respectively. The auger electron spectroscopy is used to analyze a composition and a chemical state of a portion of a sample by projecting electrons to a sample surface to discharge and detect auger electrons according to their energies, and in particular, to analyze a distribution of chemical elements in a thin film in a depthwise direction.

In FIGS. 5B and 5C, characteristic curves 552b and 552c are a dust and organics distribution in the solder bump, characteristic curves 554b and 554c are an oxygen distribution contained in the solder bump, characteristic curves 556b and 556c are a tin oxide distribution in the solder bump, and characteristic curves 558b and 558c are a tin distribution in the solder bump. Each straight line drawn along a time axis is a sputtering time required until oxygen is not detected in FIGS. 5B and 5C. The sputtering time is 3.1 min before a plasma treatment, as in FIG. 5B, but is reduced to 1 min after the plasma treatment, as in FIG. 5C. As a thickness of an etched oxide film is in proportion to the sputtering time, the thickness of the oxide film is reduced by about ⅓ after the plasma treatment.

Figure 6A:
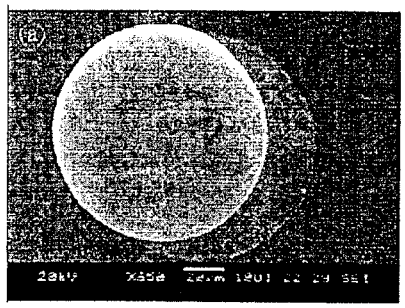
FIGS. 6A to 6F are top views illustrating a self-alignment of a solder bump in a method of fabricating the flip chip according to the present invention.
Figure 6D:
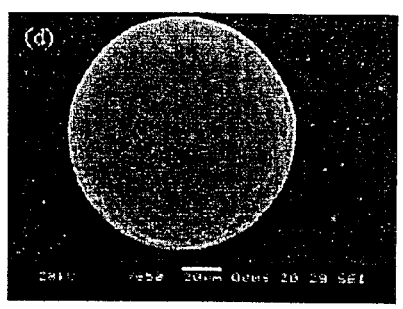
Figure 6B:
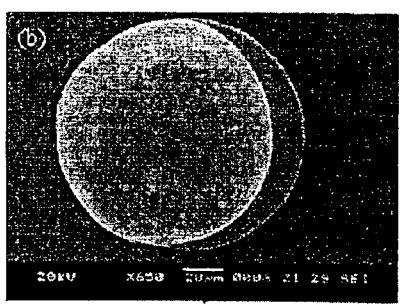
Figure 6E:
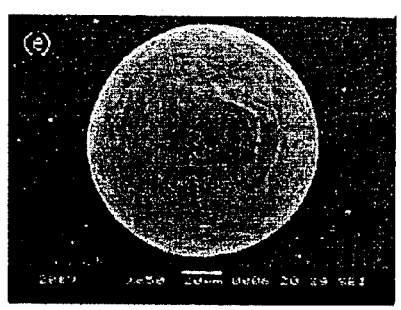
Figure 6C:
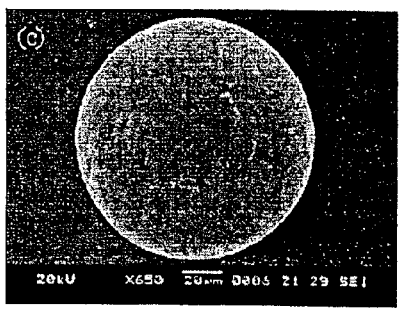

FIGS. 6A to 6F illustrate a self-alignment of a solder bump in a method of fabricating a flip chip according to the present invention. In FIGS. 6A to 6F, a self-alignment procedure of a Sn–3.5 wt % Ag solder bump during a reflow process using an Ar+10% $H_2$ plasma with power of 100 W is illustrated. FIG. 6A shows a solder ball bonded to a UBM by a laser ball bonding method under a condition of 65 A and 3 ms. FIGS. 6B, 6C, and 6D show the Sn—Ag solder ball reflowed using the Ar+10% $H_2$ plasma with power of 100 W for 40, 60, and 120 seconds, respectively.

Figure 6F:
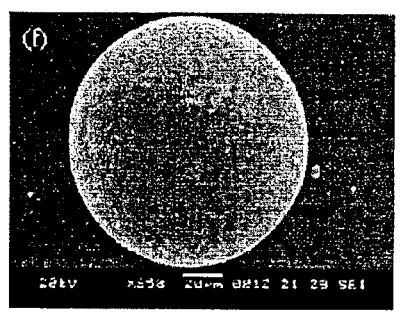

As shown in FIGS. 6A to 6F, the solder ball, which is offset from a center of a surface of the UBM by about 30 μm, is subjected to a reshaping and a self-aligning process through the plasma reflow process of the present invention. Accordingly, the solder ball coated on the UBM while being slightly offset from the center of the UBM surface is precisely positioned on the center of the UBM surface as shown in FIG. 6F.

FIGS. 7A to 7D show a flip chip solder bump according to the present invention and various flip chip solder bumps reflowed under different conditions, in which various shapes of Sn–3.5 wt % Ag solder bumps reflowed under various conditions are illustrated in FIGS. 7A to 7C. FIGS. 7E to 7H are side views corresponding to FIGS. 7A to 7D.

FIG. 7A shows a solder bump bonded to a UBM by a laser ball bonding method under conditions of 65 A and 3 ms. In this case, a solder ball is partly wetted on the UBM because of the partial irradiation of the laser beam to the solder ball. Accordingly, a bonding strength of the resulting solder bump to the UBM is poor. Furthermore, a crater is formed on an upper portion of the solder ball because of the rapid cooling. This crater may later form pores due to a gas insertion during a mounting of a flip chip having the solder bump on a circuit board. The crater vanishes where a current of the laser beam is increased or a pulse width is broadened. However, where the current of the laser beam is increased to 75 A or higher, the melted solder ball may block a capillary or reduce a life span of the capillary.

FIG. 7B shows a solder ball left on a hot plate at 250° C. for 60 seconds under an atmosphere without a flux. As shown in FIG. 7B, the solder ball is not wetted to a UBM because an oxide film on a solder ball surface wraps the melted solder even though a crater on an upper portion of the solder ball is vanished due to an expansion of the solder ball. Therefore, the bonding strength of the resulting solder bump is not improved.

FIG. 7C shows a solder ball reflowed on a hot plate at 250° C. for 60 seconds while a flux is coated on the solder ball. In this case, an oxide film of the solder ball is removed by the flux, the solder ball is reshaped as a solder bump, and any crater is vanished. In addition, it is presumed that the solder ball is desirably wetted at its contact surface with a UBM due to a sufficient removal of the oxide film, thus improving the bonding strength of the resulting solder bump to the UBM. However, where the flux remaining around the solder bump is not sufficiently removed, the flux around the solder bump corrodes a circuit to reduce the operational reliability of a package having the solder bump. Furthermore, the remaining flux in a photoelectronic element deflects a ray to cause a mis-operation of the photoelectronic element.

FIG. 7D shows a Sn–3.5 Ag solder bump with a diameter of, for example, 100 μm reflowed by an Ar+10% $H_2$ plasma with power of 100 W for 60 seconds according to the present invention. In FIG. 7D, a solder ball is reshaped to remove any crater and is desirably wetted at its contact surface with a UBM. Accordingly, the solder bump of FIG. 7D has the most desirable shape and superior wettability as compared to that of FIGS. 7A, 7B, and 7C.

Figure 8:
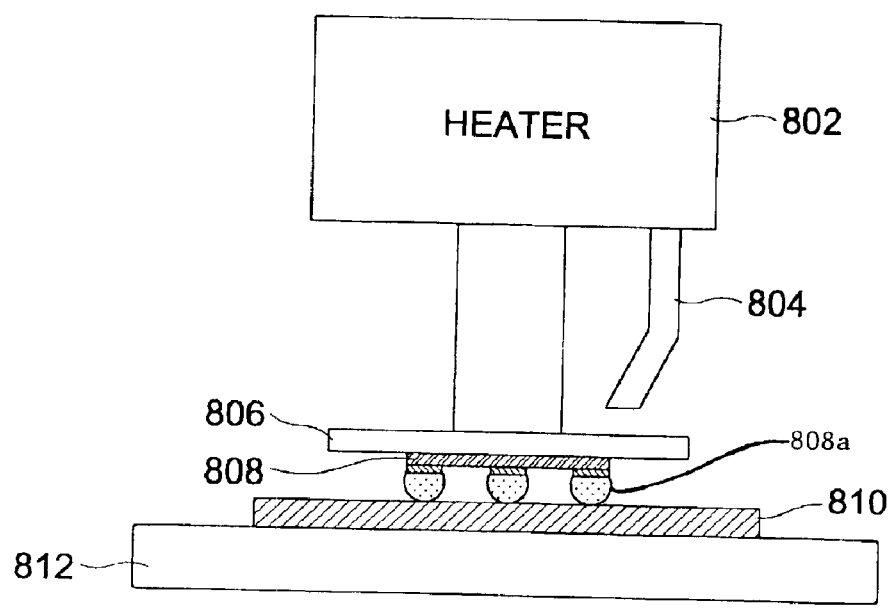
FIG. 8 illustrates a device used to mount the flip chip on a circuit board according to the present invention.

FIG. 8 illustrates a flip chip bonder used to mount a flip chip on a circuit board according to the present invention. As shown in FIG. 8, a surface, on which a solder bump is formed, of the flip chip 808 is mounted on a circuit board 810 by a chip tool 806 connected to a heater 802. The flip chip 808 is heated by the chip tool 806, and the circuit board 810 is heated by a hot plate 812 to melt the solder bump 808a to bond the flip chip 808 to the circuit board 810. A cooling gas jets through a cooling gas nozzle 804 to the flip chip 808 and the circuit board 810, which are bonded to each other, to cool the resulting structure.

Before the flip chip 808 is mounted on the circuit board 810, a plasma etching process of the present invention is conducted so as to remove an oxide film of the solder bump 808a. The plasma etching process is conducted in the chamber 312 as shown in FIG. 3, and a processing condition in the chamber 312 is adjusted so as to only remove the oxide film from the solder bump 808a and not melt the solder bump 808a. For example, a mixed gas of argon with 0 to 20% hydrogen is used, a pressure in the chamber 312 is maintained at 100 to 400 mtorr, and the solder bump 808a is exposed to a plasma thereof with power of 10 to 50 W for 10 to 120 seconds. As described above, because the plasma etching process is conducted by the plasma with lower power for a shorter period of time in comparison with a plasma reflow process of the present invention, the solder bump 808a is not heated to its melting point or higher, and the oxide film on the solder bump 808a is sufficiently removed. In other words, only the oxide film is removed from the solder bump 808a without modification of the solder bump 808a.

The flip chip 808 is mounted on the circuit board 810 within, for example, two hours after the oxide film on the solder bump 808a is removed by the plasma etching process so as to prevent a formation of a new oxide film on the solder bump 808a. As shown in FIG. 8, the flip chip 808 is positioned on a top surface metallurgy layer of the circuit board, and the circuit board 810 and the flip chip 808 are heated to a temperature higher than a melting point of the solder bump 808a, by 10° C. or higher under an atmosphere or a nitrogen atmosphere for 20 seconds or longer, to bond the flip chip 808 to the circuit board 810.

Figure 9:
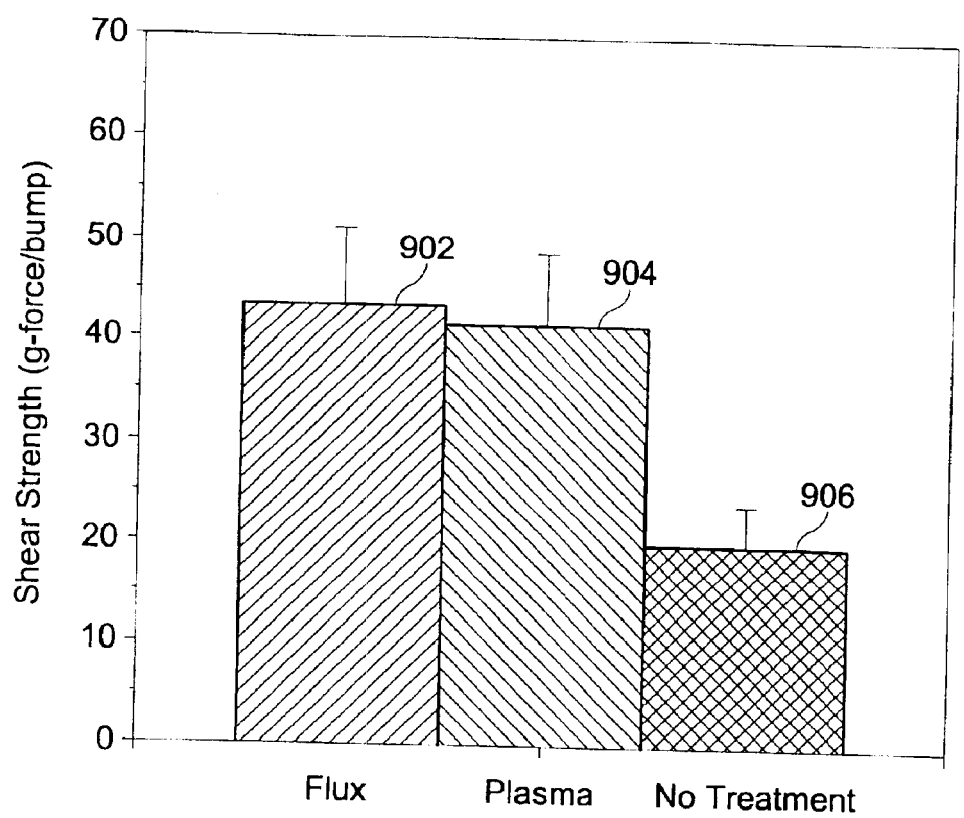
FIG. 9 is a histogram illustrating a bonding strength of the flip chip to the circuit board.

FIG. 9 shows a histogram illustrating a bonding strength of a flip chip to a circuit board, in which bonding strengths of the flip chip to the circuit board are compared with each other in three cases. A first case 902 represents bonding a Sn–3.5 wt % Ag solder bump flip chip to a circuit board using a conventional flux. A second case 904 represents bonding a flip chip to a circuit board after an oxide film of a solder bump is removed using an Ar+10% $H_2$ plasma with power of 50 W of the present invention for 60 seconds. A third case 906 represents bonding a flip chip to a circuit board under an atmosphere without any treatment. While the bonding strength in the case 904 of using the plasma is slightly lower than that in the case 902 of using the flux, it is nearly the same as to that of the case 902, within an allowable error range, and is higher than that of the case 906 by a 20 g-force or higher.

Any oxide film on a solder bump treated by a plasma process of the present invention is thin and is readily broken by an expansion of a solder volume where the solder bump is melted. Accordingly, a larger amount of a liquid solder of the solder bump, which is treated by the plasma of the present invention, flows out through the broken oxide film to wet a top surface metallurgy (TSM) of a circuit board than that of a solder bump without the present plasma treatment. Therefore, the plasma-treated solder bump of the present invention is more advantageous than the conventional solder bump in terms of, for example, a bonding strength.

As described above, an argon-hydrogen plasma reflow process of the present invention is advantageous in that environmentally friendly gas is used and a processing danger is minimized because a relatively small quantity of hydrogen is used. Additionally, in the present plasma reflow method, a solder bump is reflowed using only the plasma without an additional heat source. Other advantages of the present method includes a higher bonding strength of the solder bump as compared to a solder bump formed using a flux, and an improved self-positioning of the solder bump at a center of an UBM surface.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating a flip chip, the method comprising:
   depositing a plating seed layer on the flip chip;
   patterning a photoresist coated on the plating seed layer;
   depositing an under bump metallurgy layer on the plating seed layer according to a resulting patterned structure;
   removing the photoresist and the plating seed layer that is not covered by the under bump metallurgy layer from the flip chip;
   bonding a solder bump to the under bump metallurgy layer; and
   reflowing the solder bump using an argon-hydrogen plasma process.

2. The method as set forth in claim 1, wherein the argon-hydrogen plasma process includes:
   maintaining a pressure in a range of 250 to 270 mtorr;
   providing a mixed gas of argon with 10 to 20% hydrogen with power in a range of 100 to 200 W to generate a plasma thereof; and
   exposing the flip chip to the plasma for 30 to 120 seconds.

3. The method as set forth in claim 1, wherein the under bump metallurgy layer comprises a Cu layer and a Ni layer.

4. The method as set forth in claim 1, wherein the reflowing of the solder bump includes self-aligning the solder bump melted and reshaped in a form of a sphere by using the argon-hydrogen plasma process so as to position the solder bump at a center of the under bump metallurgy layer.

* * * * *